(12) United States Patent
Cho et al.

(10) Patent No.: US 7,413,932 B2
(45) Date of Patent: *Aug. 19, 2008

(54) POWER AMPLIFIER HAVING HIGH HEAT DISSIPATION

(75) Inventors: Jin Wook Cho, Miramar, FL (US); Hongxi Xue, Irvine, CA (US)

(73) Assignee: MediaTek Inc., Hsin-Chu Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/462,716

(22) Filed: Aug. 7, 2006

(65) Prior Publication Data

US 2006/0279361 A1 Dec. 14, 2006

Related U.S. Application Data

(60) Division of application No. 10/904,027, filed on Oct. 19, 2004, now Pat. No. 7,208,778, which is a continuation-in-part of application No. 10/064,514, filed on Jul. 23, 2002, now Pat. No. 6,849,478.

(51) Int. Cl.
*H01L 21/00* (2006.01)
(52) U.S. Cl. .................. 438/122; 438/128
(58) Field of Classification Search .......... 438/128, 438/108, 122, 125, 163, 235, 309
See application file for complete search history.

(56) References Cited

U.S. PATENT DOCUMENTS

| | | | |
|---|---|---|---|
| 5,349,239 A | 9/1994 | Sato | |
| 5,696,466 A | 12/1997 | Li | |
| 5,793,067 A | 8/1998 | Miura et al. | |
| 5,986,324 A | 11/1999 | Adlerstein et al. | |
| 6,849,478 B2 | 2/2005 | Cho et al. | |

FOREIGN PATENT DOCUMENTS

| | | |
|---|---|---|
| EP | 1 077 494 A2 | 2/2001 |
| JP | H04-025031 | 1/1992 |
| JP | 4-346262 | 12/1992 |
| JP | H05-190563 A | 7/1993 |
| JP | H07-297204 | 11/1995 |
| JP | 8-148505 | 6/1996 |
| JP | H10-223835 A | 8/1998 |
| JP | 11-74286 | 3/1999 |
| JP | 11-260833 | 9/1999 |
| JP | 2001-060593 A | 3/2001 |

*Primary Examiner*—Zandra Smith
*Assistant Examiner*—Seth Barnes
(74) *Attorney, Agent, or Firm*—Winston Hsu

(57) ABSTRACT

A power amplifier includes a substrate, a heat sink for dissipating heat, and a heterojunction bipolar transistor (HBT) disposed on the substrate. The HBT includes a collector, a base, and at least an emitter. The power amplifier further includes an emitter electrode directly connecting the heat sink and the emitter of the HBT. The emitter electrode is a flip-chip bump, and the heat sink is a metal layer that sandwiches the HBT with the substrate. Alternatively, the emitter electrode is a backside via that penetrates the substrate, and the heat sink is a metal layer, disposed on the substrate opposite the HBT.

5 Claims, 5 Drawing Sheets

POWER AMPLIFIER HAVING HIGH HEAT DISSIPATION

CROSS REFERENCE TO RELATED APPLICATIONS

This is a division of application Ser. No. 10/904,027, filed Oct. 19, 2004, from which the specification and drawings are carried forward without amendment. Additionally, application Ser. No. 10/904,027, filed Oct. 19, 2004 is itself a continuation-in-part of application Ser. No. 10/064,514, filed Jul. 23, 2002, which is included herein by reference.

BACKGROUND OF THE INVENTION

1. Field of the Invention

The present invention relates to a power amplifier, and more specifically, to a heterojunction bipolar transistor (HBT) power amplifier integrated circuit.

2. Description of the Prior Art

Power amplifier integrated circuits using HBTs are suitable for a wide range of applications and are particularly well adapted for use as high power microwave amplifiers such as those used in mobile phones.

A frequent and often serious problem with HBT power amplifiers is excessive heat buildup. Power amplifier integrated circuits operate at high current density, and hence high power density, and thus, heat generated by devices of the HBT elevates junction temperature significantly above ambient temperature. High junction temperature degrades the device reliability and limits the maximum power density of the device. Additionally, operating at higher power density risks thermal runaway of the power amplifier, in which the power amplifier suffers catastrophic device failure. Furthermore, operating at a higher junction temperature reduces device mean time to failure (MTTF). Typically, for a given application, larger devices are required to overcome this problem, leading to increased cost and inefficient use of space.

Adlerstein et al. in U.S. Pat. No. 5,986,324, which is incorporated herein by reference, describes in detail an HBT structure and operation thereof. Miura et al. in U.S. Pat. No. 5,793,067, which is also incorporated herein by reference, teaches how a transistor structure can be made with widened leads to reduce thermal resistance. However, both Adlerstein et al. and Miura et al. teach the use of an emitter air-bridge that is costly and causes undue fabrication complexity.

The prior art heat dissipation in power amplifier transistors, such as HBTs, is inadequate. Moreover, prior art solutions providing heat dissipation are difficult and costly to manufacture, impacting yield and reliability. Such insufficient heat dissipation prevents prior art power amplifiers from operating at high current densities or high power, and dictates a larger power amplifier for a given application. Finally, the cost associated with using the air-bridge for cooling is also much higher compared to a die without the air-bridge.

SUMMARY OF THE INVENTION

It is therefore a primary objective of the present invention to provide a power amplifier integrated circuit having high heat dissipation to solve the problems of the prior art.

Briefly summarized, the present invention includes a substrate, a heat sink for dissipating heat, a transistor disposed on the substrate including a collector, a base, and at least an emitter. The present invention further includes an emitter electrode directly connecting the heat sink and the emitter.

According to one preferred embodiment of the present invention, the transistor is a heterojunction bipolar transistor (HBT).

According to one preferred embodiment of the present invention, the emitter electrode is a flip-chip bump and the heat sink is a metal layer, and the heat sink and the substrate sandwich the transistor.

According to another preferred embodiment of the present invention, the emitter electrode is a backside via penetrating the substrate and the heat sink is a metal layer, and the heat sink and the transistor sandwich the substrate.

It is an advantage of the present invention that heat accumulated in the transistor is readily dissipated through the emitter electrode and the heat sink, such that the transistor can operate at a substantially high power.

These and other objectives of the present invention will no doubt become obvious to those of ordinary skill in the art after reading the following detailed description of the preferred embodiment that is illustrated in the various figures and drawings.

DETAILED DESCRIPTION

The present invention will be described in two embodiments. Both embodiments comprise a heterojunction bipolar transistor (HBT) disposed on a GaAs substrate. However, the present invention is not limited by such and can be utilized with other types of transistors on different substrates. Furthermore, the present invention should not be construed as limited to application as a power amplifier.

Figure 1:
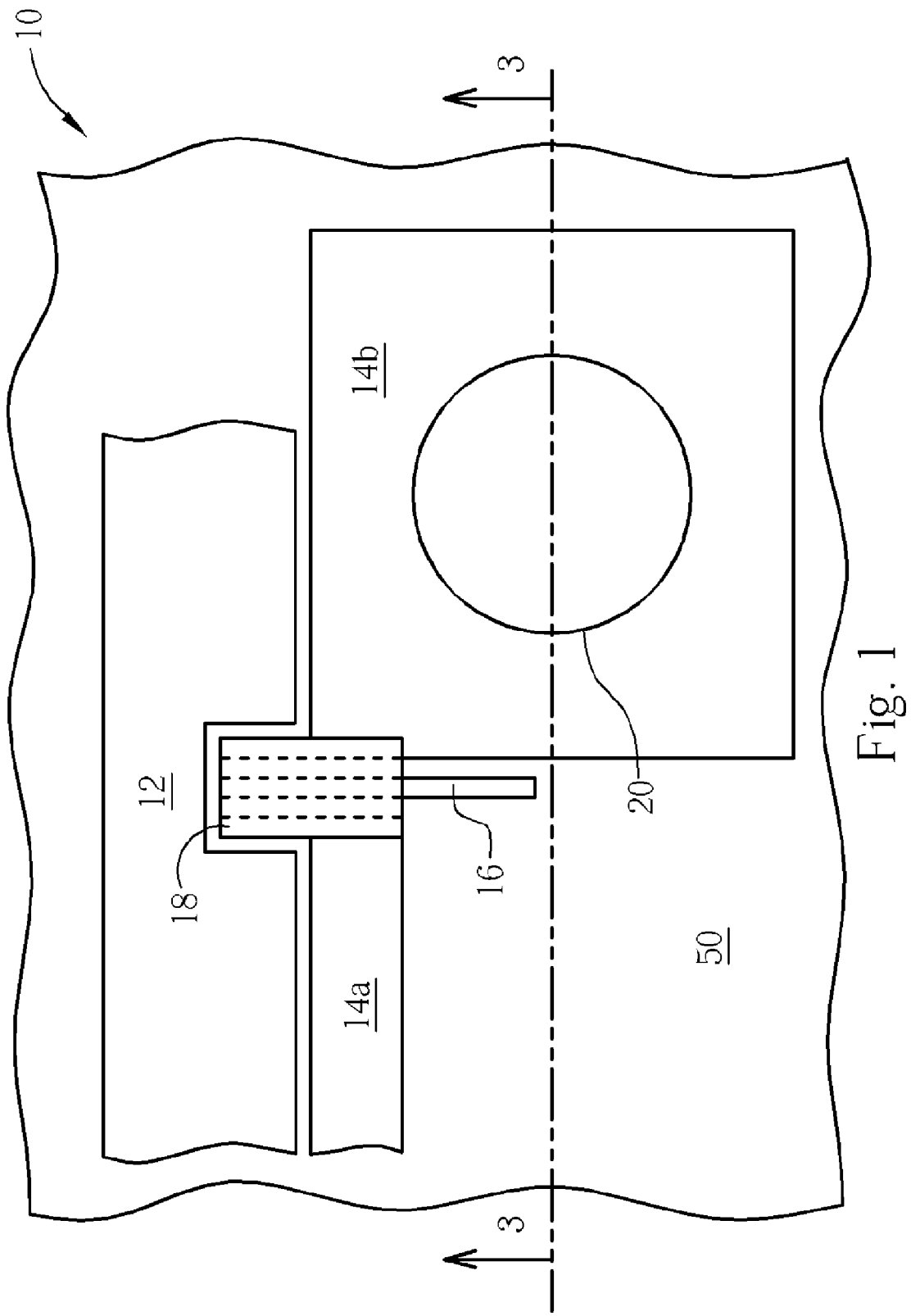
FIG. 1 is a plan view of an HBT power amplifier according to the preferred embodiment of the present invention.

Please refer to FIG. 1. FIG. 1 shows a plan view of an HBT power amplifier 10 according to the preferred embodiment of the present invention. Typically, HBTs comprise pluralities of bases, emitters, collectors, and other functional devices, however, the HBT power amplifier 10 is shown as simplified for explanatory purposes. The HBT 10 comprises a collector 12, an emitter 14a, an enlarged emitter 14b, and a base 16 all disposed on a substrate 50. The substrate 50 is a GaAs substrate, but may be another suitable substrate material. The emitter 14a and the emitter 14b are formed by a metallization process that is well known in the art. Both emitters 14a, 14b are electrically and thermally connected together by another metallization layer 18. The enlarged emitter 14b is connected to a heat sink (item 22, FIG. 3) by an emitter electrode 20. In the preferred embodiment, the emitter electrode 20 is a flip-chip bump that connects the enlarged emitter 14b to the heat sink 22 for heat dissipation and electrical grounding. The electrical operation of the HBT 10 is well known in the art and will not be described in detail in this description.

Figure 2:
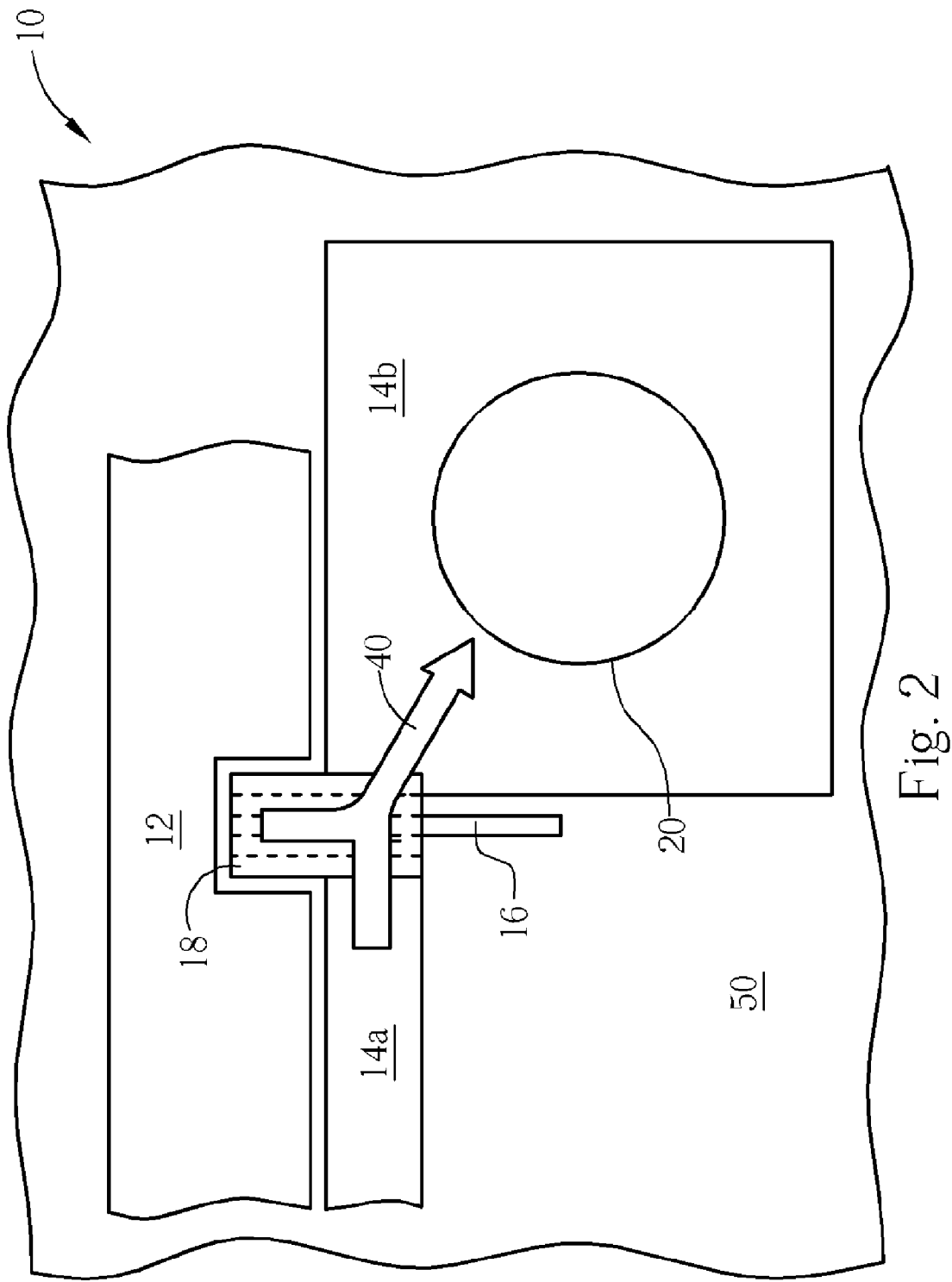
FIG. 2 is a schematic diagram of the HBT power amplifier of FIG. 1 dissipating heat.

FIG. 2 shows the HBT power amplifier 10 during operation. Heat is generated in proportion to operating current density or power of the HBT 10 and is accumulated at the emitters 14a, 14b. Heat as represented by arrow 40 flows from the emitters 14a, 14b to the flip-chip bump 20 and finally to the heat sink 22. While some heat is radiated to surrounding components and materials, a large portion of heat, as represented by the arrow 40, is thermally conducted through the efficient path provided by the flip-chip bump 20 and the heat sink 22. In this way, the present invention provides enhanced cooling to functional devices of the HBT such as the emitters 14a, 14b.

Figure 3:
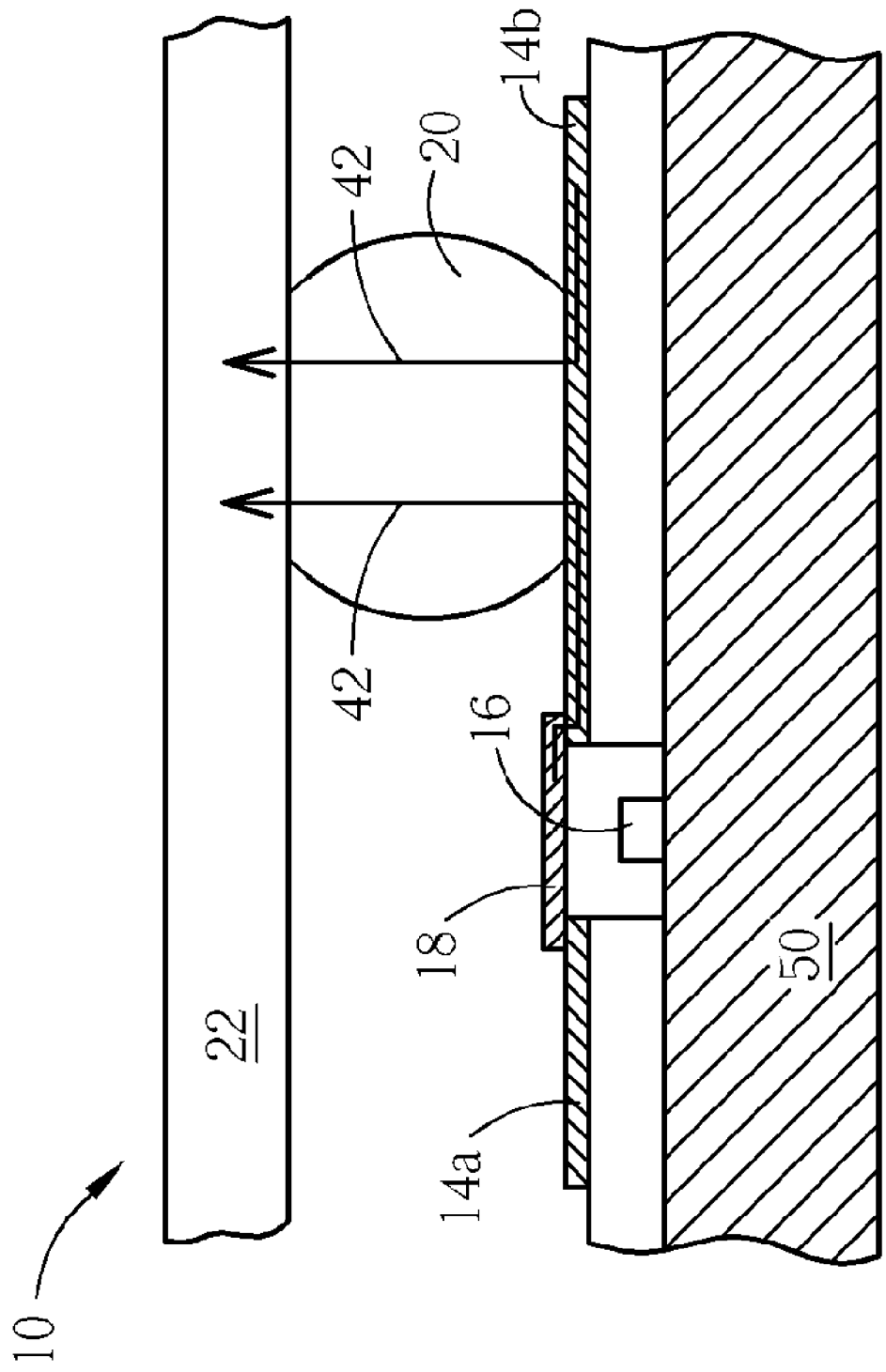
FIG. 3 is a cross-sectional view of the HBT power amplifier of FIG. 1.

Please refer to FIG. 3. FIG. 3 shows a cross-sectional view of the HBT power amplifier 10 of FIG. 1 along a section line 3-3 shown in FIG. 1. In FIG. 3, the heat sink 22 is a metal layer. The flip-chip bump 20 is shown connecting the emitter 14b and the metal layer 22. Heat represented by arrows 42 can be seen flowing from the emitters 14a, 14b through the flip-chip bump 20 and finally to the metal layer 22. The enhanced thermal conduction as provided by the preferred embodiment of the present invention allows the HBT power amplifier 10 to operate at a substantially high power.

Figure 4:
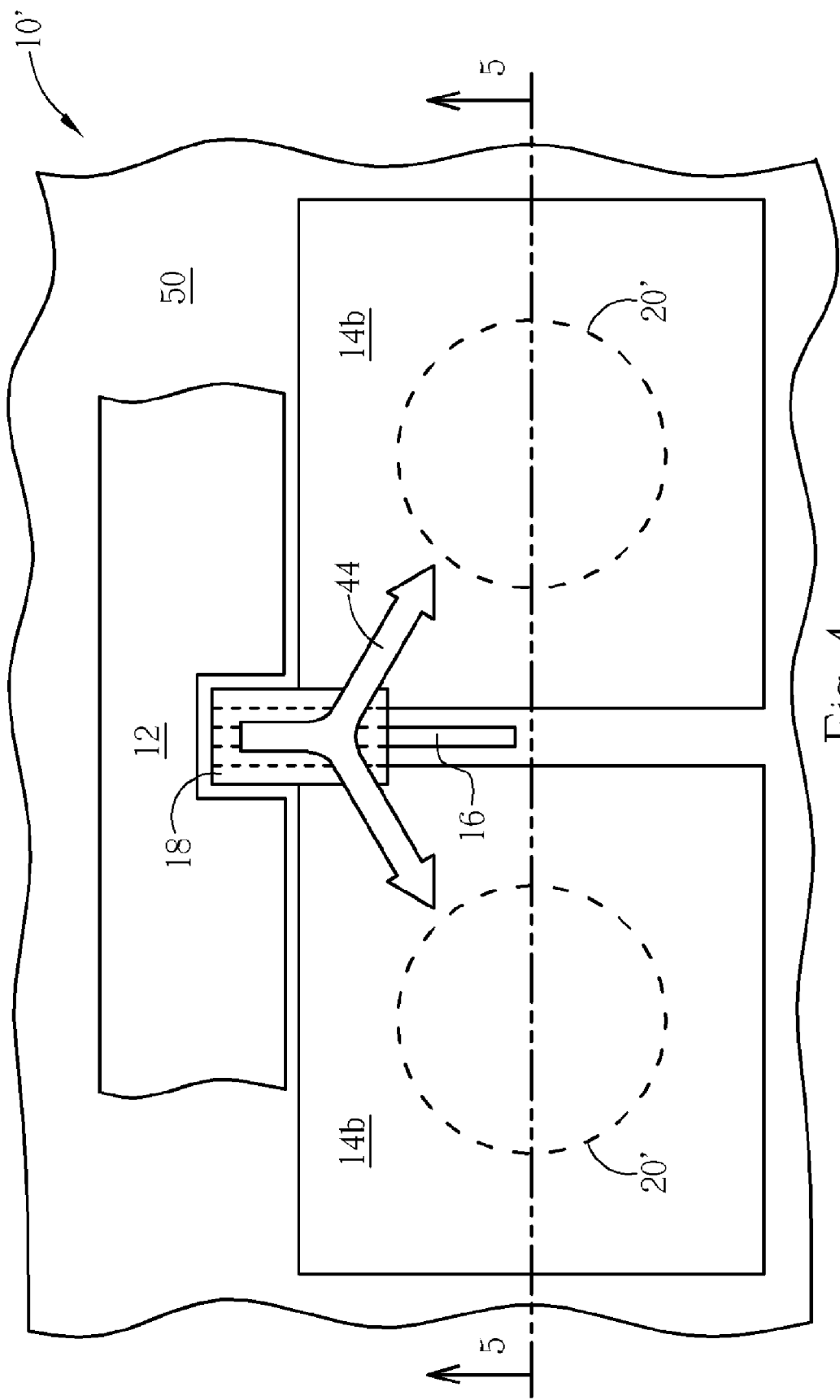
FIG. 4 is a schematic diagram of an HBT power amplifier according to a second embodiment of the present invention.

FIG. 4 shows a schematic diagram of an HBT power amplifier 10' according to a second embodiment of the present invention. The HBT power amplifier 10' is similar to the HBT power amplifier 10 except that the HBT 10' comprises a second enlarged emitter 14b rather than the emitter 14a. The HBT power amplifier 10' further differs in that emitter electrodes 20' are backside vias provided to both enlarged emitters 14b. As a result, heat dissipation from the emitters 14b is evenly distributed between the emitters 14b as represented by an arrow 44. Similar to the preferred embodiment, the backside vias 20' conduct the heat 44 to a heat sink (item 30, FIG. 5). The electrical operation of the HBT 10' is substantially the same as that of HBT 10. Furthermore, electrical grounding of the emitters 14b provided by the backside vias 20' is essentially identical to the electrical grounding provided by the flip-chip bumps 20 in the preferred embodiment. A further difference of the second embodiment as shown in FIG. 4 is that the metallization layer 18 is optional as emitters 14b are both thermally connected and electrically grounded to the heat sink 30. With this structure, the present invention provides enhanced cooling to functional devices of the HBT such as the emitters 14b.

Figure 5:
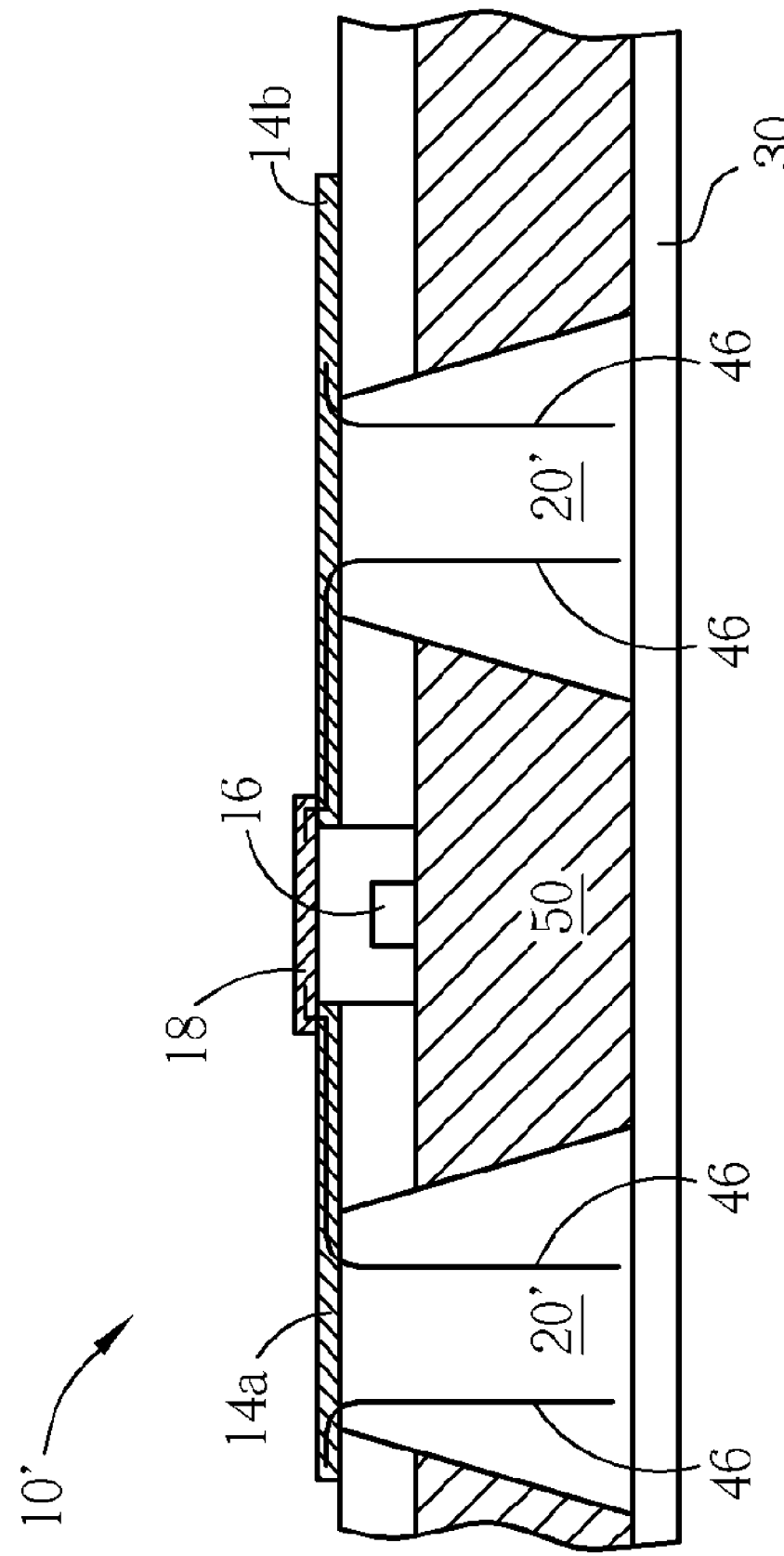
FIG. 5 is a cross-sectional view of the HBT power amplifier of FIG. 4.

Please refer to FIG. 5. FIG. 5 is a cross-sectional view of the HBT power amplifier 10' of FIG. 4 along a section line 5-5 shown in FIG. 4. The heat sink 30 is a backside metal layer. As shown in FIG. 5, backside vias 20' penetrate the substrate 50. Heat is conducted from the emitters 14b through the backside vias 20' and to the metal layer 30 as represented by arrows 46. The enhanced thermal conduction as provided by the second embodiment of the present invention allows the HBT power amplifier 10' to operate at a substantially high power.

Naturally, the present invention as described in the preferred embodiment and the second embodiment, can be applied to an HBT power amplifier having arrays of bases, emitters, collectors, and other functional devices. Fabrication of the present invention HBT power amplifiers 10, 10' can be accomplished by currently available semiconductor manufacturing technologies.

Generally, the emitter areas are enlarged, as illustrated by emitters 14b, so that the flip-chip bump 20 or the backside via 20' can be placed depending on the specific application of the HBT amplifier 10, 10'. An increased amount of flip-chip bumps 20 or backside vias 20' tends to increase thermal efficiency at the expense of device area. Thus, a specific layout to maximize thermal efficiency while minimizing device area is a design choice. In one embodiment, the area of the enlarged emitter 14b is greater than the area of the emitter 14a, and the enlarged emitter 14b has a center of area located laterally away from the collector 12 and the base 16.

In contrast to the prior art, the present invention provides an efficient thermal path to the heat sink in the close proximity of the source of heat generation, which is the emitter of the transistor. The emitter electrode provides thermal conduction and electrical grounding to the emitter. The emitter electrode provided can be a flip-chip bump or a backside via. The heat sink can be a metal layer that can be directly disposed on a substrate. For these reasons, the present invention provides a heat conduction path that is more thermally efficient and more cost effective than that provided by the prior art. Accordingly, the present invention power amplifier can operate at a higher current density and associated higher power than a comparable prior art power amplifier.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a heat dissipating power amplifier integrated circuit, the method comprising:
   providing a planar substrate;
   providing a heat sink for dissipating heat;
   integrally forming a transistor on the substrate, the transistor comprising a collector, a base, and an emitter having an enlarged portion located laterally away from the collector and the base; and
   electrically and thermally coupling the heat sink to the enlarged portion of the emitter with an emitter electrode;
   wherein in a plane of the substrate, an area of the enlarged portion of the emitter is greater than an area of the emitter electrode, and the enlarged portion of the emitter has a center of area located laterally away from the collector and the base.

2. The method of claim 1 wherein forming the transistor comprises:
   disposing a metallization layer on the substrate to form the emitter; and
   disposing a second metallization layer to mutually connect emitters.

3. The method of claim 1 further comprising:
   electrically grounding the emitter through the emitter electrode and the heat sink.

4. The method of claim 1 further comprising:
   arraying a plurality of transistors and a plurality of emitter electrodes to form a functional device.

5. The method of claim 1 wherein the emitter electrode directly connects the heat sink and the enlarged portion of the emitter.

* * * * *